(12) United States Patent
Zaka et al.

(10) Patent No.: US 9,881,841 B2
(45) Date of Patent: Jan. 30, 2018

(54) METHODS FOR FABRICATING INTEGRATED CIRCUITS WITH IMPROVED IMPLANTATION PROCESSES (71) Applicant: GLOBALFOUNDRIES, Inc., Grand Cayman (KY)

(72) Inventors: Alban Zaka, Dresden (DE); Ran Yan, Dresden (DE); El Mehdi Bazizi, Dresden (DE); Jan Hoentschel, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 15/074,483

(22) Filed: Mar. 18, 2016

(65) Prior Publication Data
US 2016/0204038 A1 Jul. 14, 2016

Related U.S. Application Data (62) Division of application No. 14/244,651, filed on Apr. 3, 2014, now Pat. No. 9,312,189.

(51) Int. Cl.
H01L 21/336 (2006.01)
H01L 21/8238 (2006.01)
H01L 21/265 (2006.01)
H01L 21/266 (2006.01)
H01L 21/324 (2006.01)
H01L 29/66 (2006.01)
H01L 29/167 (2006.01)
(Continued)

(52) U.S. Cl.
CPC .... H01L 21/823814 (2013.01); H01L 21/266 (2013.01); H01L 21/268 (2013.01); H01L 21/26513 (2013.01); H01L 21/26586 (2013.01); H01L 21/324 (2013.01); H01L 21/823418 (2013.01); H01L 21/823468 (2013.01); H01L 21/823807 (2013.01); H01L 27/0924 (2013.01); H01L 29/1041 (2013.01); H01L 29/167 (2013.01); H01L 29/6656 (2013.01); H01L 29/6659 (2013.01); H01L 29/66492 (2013.01); H01L 21/26506 (2013.01)

(58) Field of Classification Search
CPC .............. H01L 2924/1305; H01L 2924/13062
See application file for complete search history.

(56) References Cited

U.S. PATENT DOCUMENTS 7,498,642 B2 * 3/2009 Chen ................. H01L 21/26506
 257/345
8,664,073 B2 3/2014 Lee et al.
9,000,505 B2 * 4/2015 Edwards ........... H01L 21/26586
 257/300

* cited by examiner

Primary Examiner — Zandra Smith
Assistant Examiner — Andre' C Stevenson
(74) Attorney, Agent, or Firm — Lorenz & Kopf, LLP (57) ABSTRACT Methods for fabricating integrated circuits are provided. In an embodiment, a method for fabricating an integrated circuit includes providing a structure having an n-channel gate stack and a p-channel gate stack formed over a semiconductor substrate. The method includes forming halo implant regions in the semiconductor substrate adjacent the p-channel gate stack and forming extension implant regions in the semiconductor substrate adjacent the p-channel gate stack. The method further includes annealing the halo implant regions and the extension implant regions in the semiconductor substrate adjacent the p-channel gate stack. Also, the method forms extension implant regions in the semiconductor substrate adjacent the n-channel gate stack.

19 Claims, 6 Drawing Sheets (51) Int. Cl.
*H01L 21/268* (2006.01)
*H01L 21/8234* (2006.01)
*H01L 27/092* (2006.01)
*H01L 29/10* (2006.01)

METHODS FOR FABRICATING INTEGRATED CIRCUITS WITH IMPROVED IMPLANTATION PROCESSES

CROSS-REFERENCE TO RELATED APPLICATION

This is a divisional application of U.S. patent application Ser. No. 14/244,651, filed Apr. 3, 2014.

TECHNICAL FIELD

The technical field generally relates to methods for fabricating integrated circuits, and more particularly relates to methods for fabricating integrated circuits with improved implantation processes.

BACKGROUND

The fabrication of advanced integrated circuits requires the formation of a large number of circuit elements in a given chip area according to a specified circuit layout. Field effect transistors (NMOS and PMOS transistors) represent one important type of circuit elements that substantially determine performance of the integrated circuits. During the fabrication of complex integrated circuits using, for instance, MOS technology, millions of transistors, e.g., NMOS transistors and/or PMOS transistors are formed on a substrate including a crystalline semiconductor layer. A field effect transistor, irrespective of whether an NMOS transistor or a PMOS transistor is considered, typically comprises so-called PN junctions that are formed by an interface of highly doped regions, referred to as drain and source regions, with a slightly doped or non-doped region, such as a channel region, disposed between the highly doped regions source/drain regions. Improvement of the electrical performance characteristics of semiconductor devices, such as transistors, and the overall performance capabilities of integrated circuit devices that incorporate such devices is constantly sought.

Ion implantation is a technique that is employed in many technical fields to implant dopant ions into a substrate so as to alter the characteristics of the substrate or of a specified portion thereof. For example, the rapid development of advanced devices in the semiconductor industry is based on, among other things, the ability to generate highly complex dopant profiles within tiny regions of a semiconductor substrate by performing advanced implantation techniques through a masking.

When implanting specified ions into a substrate, the desired lateral implant profile may be readily obtained by providing correspondingly adapted implantation masks. A desired vertical implant profile may be achieved by, among other things, controlling the acceleration energy of the ions during the implantation process such that the majority of the ions at positioned at a desired depth in the substrate. Moreover, by appropriately selecting the dopant dose, i.e., the number of ions per unit area of the ion beam impinging on a substrate, comparably high concentrations of atoms may be incorporated into a substrate as compared to other doping techniques, such as diffusion. In the case of an illustrative transistor, ion implantation may be used to form various doped regions, such as halo implant regions, extension implant regions and deep source/drain implant regions, etc.

As device dimensions are continually reduced, it is important that the depth of the source/drain regions for a transistor be shallow and that the implanted dopants are, to the extent possible, fully activated. Thus, heating processes such as a flash anneal or a laser anneal are performed for a very short duration to limit the diffusion of the implanted ions, so as to maintain the desired shallow dopant profile, while at the same time maximizing dopant activation. In general, the higher the annealing temperature is the greater the extent of dopant activation will be. However, the millisecond anneal times performed to activate shallow implant regions are insufficient to cure all of the damage to the substrate resulting from the ion implantation processes. Further, processes for maximizing dopant activation in certain implant regions may deactivate or otherwise damage dopants in other implant regions.

Accordingly, it is desirable to provide methods for fabricating integrated circuits with improved implantation processes. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits are provided. In one exemplary embodiment, a method for fabricating an integrated circuit includes providing a structure having an n-channel gate stack and a p-channel gate stack formed over a semiconductor substrate. The method includes forming halo implant regions in the semiconductor substrate adjacent the p-channel gate stack and forming extension implant regions in the semiconductor substrate adjacent the p-channel gate stack. The method further includes annealing the halo implant regions and the extension implant regions in the semiconductor substrate adjacent the p-channel gate stack. Also, the method forms extension implant regions in the semiconductor substrate adjacent the n-channel gate stack.

In accordance with another embodiment, a method is provided for fabricating an integrated circuit. The method for fabricating an integrated circuit includes providing a semiconductor substrate with first gates overlying second conductive type regions in the semiconductor substrate and second gates overlying first conductive type regions in the semiconductor substrate. The method includes forming halo implant regions in the semiconductor substrate adjacent selected second gates. Further, the method includes forming extension implant regions in the semiconductor substrate adjacent the selected second gates. Also, the method includes annealing the halo implant regions and the extension implant regions in the semiconductor substrate adjacent the selected second gates by performing a laser anneal process. The method forms extension implant regions in the semiconductor substrate adjacent selected first gates.

BRIEF DESCRIPTION OF THE DRAWINGS

Embodiments of methods for fabricating integrated circuits with improved ion implantation processes will be described in conjunction with the following drawing figures, wherein like numerals denote like elements, and wherein.

DETAILED DESCRIPTION

The following detailed description is merely exemplary in nature and is not intended to limit the various embodiments of the methods for fabricating integrated circuits with improved ion implantation processes claimed herein. Furthermore, there is no intention to be bound by any expressed or implied theory presented in the preceding technical field, background or brief summary, or in the following detailed description.

Methods for fabricating integrated circuits with improved ion implantation processes as described herein avoid issues faced by conventional ion implantation processes. For example, selected implant regions formed according the processes herein may be specifically annealed by laser anneal processes while other implant regions avoid or have reduced exposure to annealing steps, and particularly to laser anneal processes. The criticality of the implant regions may be determined by the importance of the implant regions to device performance, the fragility of the implant regions, or other factors. For example, in embodiments herein PMOS device performance for low power, high-k metal gate technology may be improved by annealing halo implant regions and source/drain extension implant regions in the semiconductor substrate adjacent p-channel gate stacks with laser spike anneal (LSA) processes. Such implant regions typically utilize boron or indium as dopants. The LSA processes may cause dopant deactivation in implant regions doped with arsenic or phosphorus. In an exemplary embodiment, arsenic and/or phosphorus may be used in source/drain extension implant regions in the semiconductor substrate adjacent n-channel gate stacks. The deactivation phenomena severely degrades the within wafer uniformity. Specifically, implant regions in different portions of the implanted semiconductor substrate may be differently degraded, harming device uniformity. Therefore, embodiments are provided in which implant processes for forming source/drain extension implant regions in the semiconductor substrate adjacent n-channel gates are deferred until after certain LSA processes.

In conventional integrated circuit fabrication processes, ion implantations are performed and completed around p-channel gate stacks before ion implantations are performed and completed around n-channel gate stacks. This sequence typically simplifies or optimizes formation and patterning of masks. Specifically, n-channel gate stacks may be masked first while ion implantations are performed in the semiconductor substrate adjacent p-channel gate stacks. Then, the n-channel gate stacks may be unmasked and the p-channel gate stacks masked during ion implantation in the semiconductor substrate adjacent n-channel gate stacks. However, it has been determined that device performance may be improved by reordering ion implantations and laser annealing processes around p-channel and n-channel gate stacks as described herein.

FIGS. 1-11 illustrate methods for fabricating integrated circuits in accordance with an exemplary embodiment. Various steps in the design and composition of integrated circuits are well known and so, in the interest of brevity, many conventional steps will only be mentioned briefly herein or will be omitted entirely without providing the known process details. Further, it is noted that integrated circuits include a varying number of components and that single components shown in the illustrations may be representative of multiple components.

Figure 1:
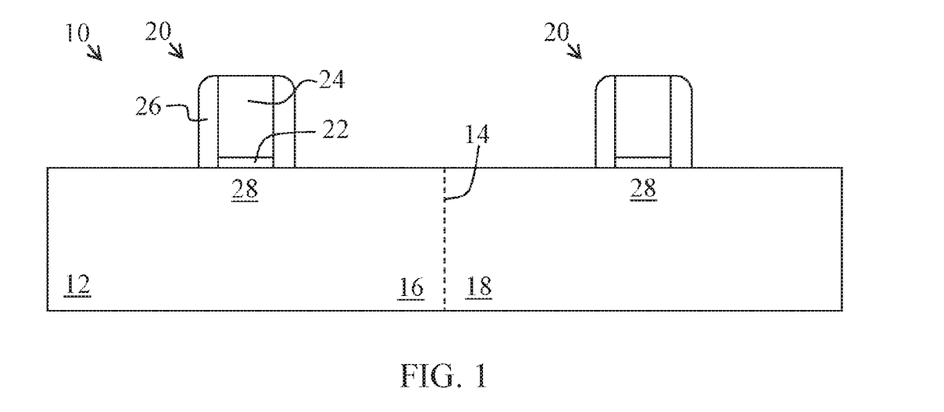
FIGS. 1-10 are cross-sectional views of method steps for fabricating an integrated circuit with improved implantation processes.

In the exemplary embodiment of FIG. 1, a method for fabricating an integrated circuit 10 includes providing a semiconductor substrate 12. An exemplary semiconductor substrate 12 is formed from semiconductor material such as silicon, including the relatively pure silicon materials typically used in the semiconductor industry as well as silicon admixed with other elements, such as germanium and the like. Alternatively, the semiconductor substrate 12 can be realized as germanium, gallium arsenide, and the like, or the semiconductor substrate 12 can include layers of different semiconductor materials. The semiconductor substrate 12 may be realized as a bulk silicon or silicon-on-insulator (SOI) wafer.

In the exemplary process of FIG. 1, the semiconductor substrate 12 is formed with an isolation region, represented by dashed line 14, such as a shallow trench isolation (STI) barrier. The isolation region 14 separates the semiconductor substrate 12 into a first region 16 and a second region 18. Using well-known techniques, the second region 18 is masked and p-type dopant ions, such as boron ions, are implanted into the first region 16 to form the first region 16 as a p-type well. Likewise, the first region 16 is masked and n-type dopant ions, such as arsenic or phosphorus ions, are implanted into the second region 18 to form the first region 18 as an n-type well. While FIG. 1 depicts a single isolation region 14 between a first region 16 and a second region 18, the semiconductor substrate 12 is typically formed with millions of regions 14, 16 and 18 as is well known.

After doping the first regions 16 and second regions 18 in the semiconductor substrate 12, gate structures 20 are formed overlying the semiconductor substrate 12. As used herein, an "overlying" structure may lie directly on or indirectly over an underlying layer. To form the gate structures 20, a gate dielectric layer 22 and a gate material 24 are deposited over first regions 16 and second regions 18 and are etched. As formed, the gate structures 20 in the first region 16 are NMOS or n-channel gate structures and the gate structures 20 in the second region 18 are PMOS or p-channel gate structures. As shown, a first spacer 26 is formed around each gate structure 20. Specifically, a spacer material, such as silicon oxide, is deposited over the gate structures 20 and semiconductor substrate 12 and is etched to form the first spacers 26 over the semiconductor substrate 12 and around the gate structures 20. As shown, the gate structures define underlying channel regions 28 in the semiconductor substrate 12.

Figure 2:
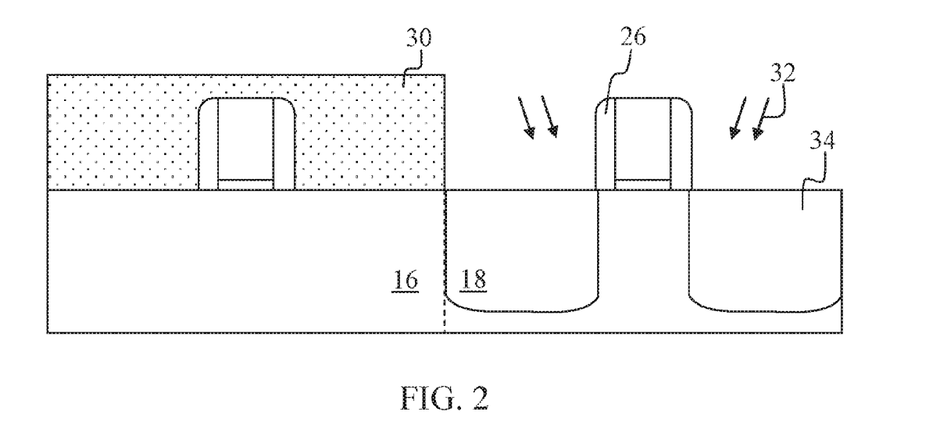

In FIG. 2, the method continues by performing post-gate formation ion implantation processes. As shown, a resist mask 30 is deposited and patterned to cover the first region 16. Resist mask 30 can be one of a number of different types of resist, including optical photoresist responsive to visible and near UV light, deep UV resist and the like. Alternatively, resist layer 30 can be an inorganic resist layer, an X-ray resist layer and the like. In an exemplary embodiment, a series of ion implantations begins with a pre-amorphization implant process. The pre-amorphization implant process implants ions, indicated by arrows 32, to form an amorphized layer 34 in the second region 18. As shown, the amorphized layer 34 partially extends under the first spacer 26. An exemplary pre-amorphization implant process is accomplished by implanting amorphizing ions 32 such as germanium, xenon, or arsenic, into the substrate 12 at a tilt angle (i.e., the direction of the incident amorphizing ion beam is not normal to the surface of the semiconductor substrate 12). It is noted that the pre-amorphization implant process is optional.

Figure 3:
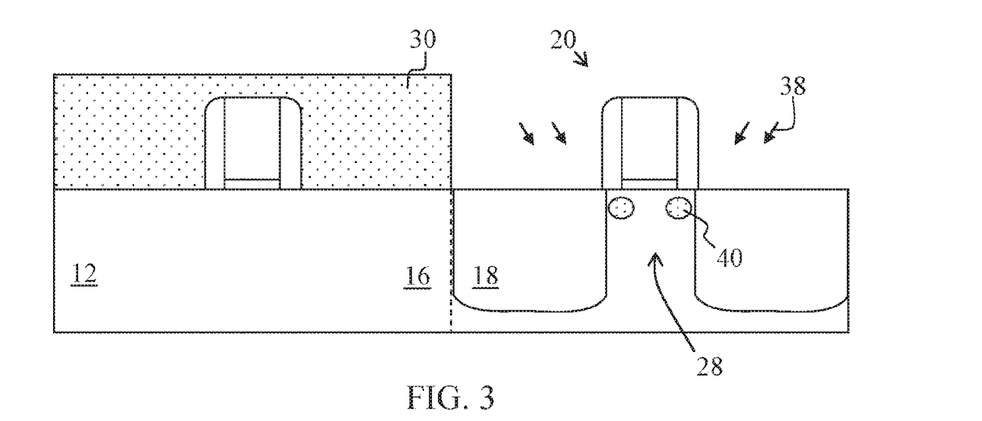

In FIG. 3, the photoresist mask 30 remains overlying the first region 16 and the series of ion implantations continues with a first pocket implantation for implanting ions, indicated by arrows 38, to form pocket implants 40. Each ion implantation for forming pocket implants as described herein may be performed with an implant angle of approximately 0° to approximately 30°, to an implant depth of approximately 5 nm to approximately 42 nm; by implanting ions selected from a group consisting essentially of B+, BF2+, In+, Ga+, As+, Sb+, P+, Ge, N and F; at an energy in the range of about 3 KeV to about 30 KeV. In the exemplary embodiment of FIG. 3, the pocket implants 40 are halo implant regions. Halo implant regions are regions that are implanted with a dopant that is opposite in conductivity type to the conductivity type of an adjacent region (or an anticipated adjacent region). The dopant of the halo implant regions retards diffusion of the dopant of the adjacent region. Exemplary halo implant regions 40 are formed at opposing sides of the channel region 28. Halo implant regions may be implanted using a low energy at a small angle to the surface of the semiconductor substrate 12 so that the halo implant regions extend beneath the gate structure 20 to beyond the anticipated locations of the ends of later-formed source/drain extensions after annealing.

Figure 4:
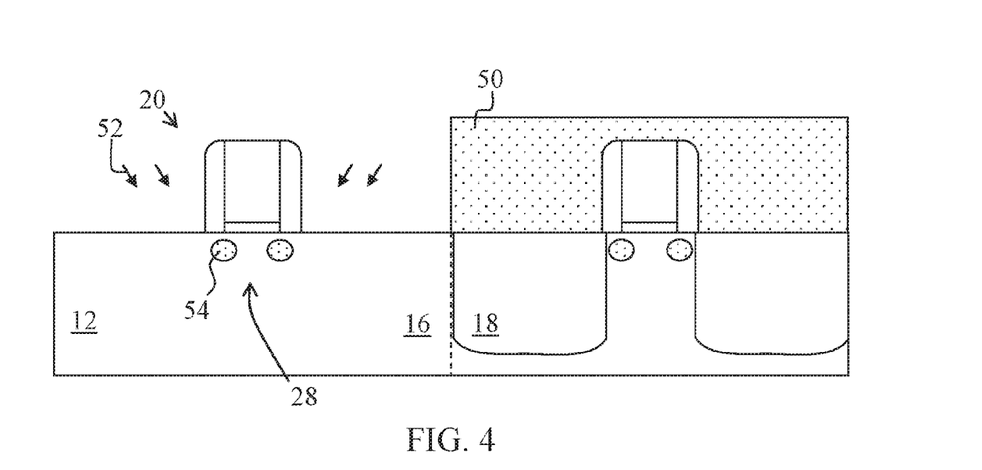

After performing the first ion implantation to form halo implant regions 40 in second region 18, the mask 30 is removed from first region 16, as shown in FIG. 4. A second resist mask 50 is deposited and patterned to cover the second region 18. Second resist mask 50 may be formed of the same material and in the same method as resist mask 30, or as one of the other types of masks described above.

The exemplary method continues with a series of ion implantations on the first region 16. Specifically, a second pocket implantation for implanting ions, indicated by arrows 52, is performed to form pocket implants 54. Pocket implants 54 may be halo implant regions or source/drain extension implant regions. In the exemplary embodiment of FIG. 4, the pocket implants 54 are halo implant regions. Exemplary halo implant regions 54 are formed at opposing sides of the channel region 28 using a low energy at a small angle to the surface of the semiconductor substrate 12 so that the halo implant regions extend beneath the gate structure 20 to beyond the anticipated locations of the ends of later-formed source/drain extensions after annealing.

Figure 5:
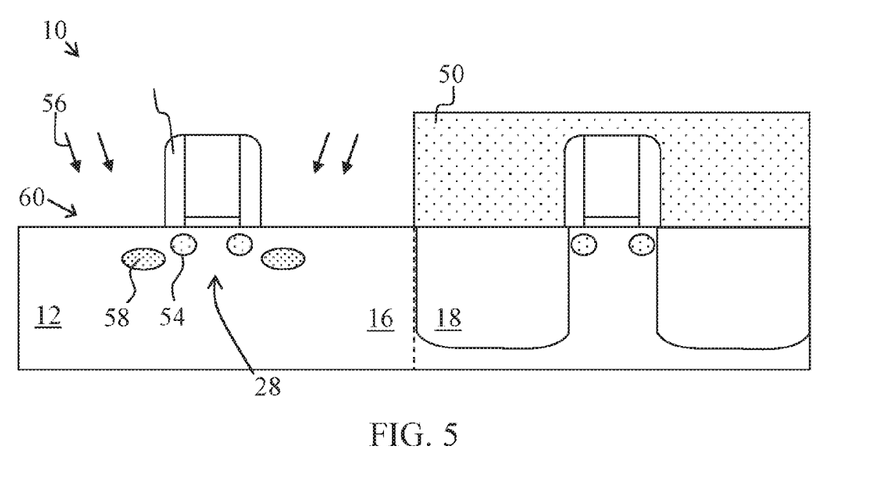

As shown in FIG. 5, the second photoresist mask 50 remains overlying the second region 18 while a third pocket implantation for implanting ions, indicated by arrows 56, is performed to form pocket implants 58. The pocket implants 58 may be source/drain extension implant regions or halo implant regions. In the exemplary embodiment of FIG. 5, the pocket implants 58 are formed as source/drain extension implant regions. Extension implant regions are regions that are implanted with a dopant that is the same in conductivity type to the conductivity type of the adjacent source/drain region (or an anticipated adjacent source/drain region). The dopant of the extension implant regions directs diffusion of the dopant of the adjacent source/drain region for increased control over formation of the source/drain region. Exemplary extension implant regions 58 are formed between the channel region 28 and the anticipated location of the later-formed source/drain regions. The third pocket implantation may be performed using a low energy at a small angle to the surface of the semiconductor substrate 12 so that the extension implant regions extend beneath the spacer 26. The implantation energy is preferably less than the energy used for implanting the later formed source/drain regions. Further, exemplary extension implant regions extend to a depth shallower than the depth of the later-formed source/drain regions.

FIGS. 4-5 illustrate performance and completion of ion implantations to form a layer 60 of pocket implants in the first region 16. Specifically, formation of the integrated circuit 10 involves no further ion implantations to form pocket implants in region 16 before formation of source/drain regions. While the exemplary layer 60 of pocket implants includes pocket implant 54 and pocket implant 58, it is envisioned that the initial layer 60 include as few as one pocket implant or as many as five or more pocket implants as needed in region 16. The layer 60 may include any appropriate number of halo implant regions and extension implant regions.

Figure 6:
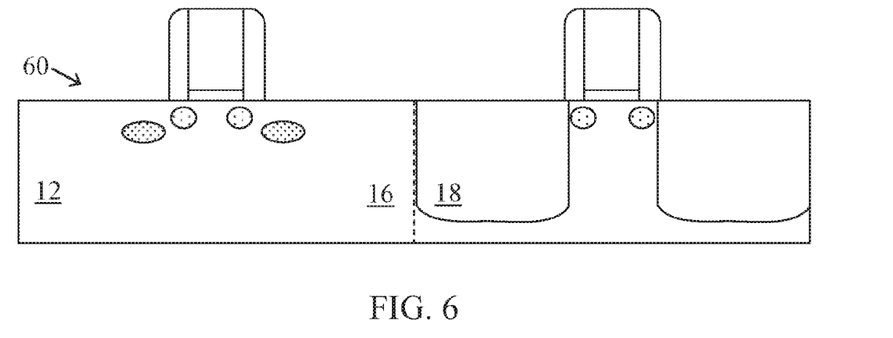

After performing the series of ion implantations to form the layer 60 of pocket implants in region 16, the mask 50 is removed from second region 18, as shown in FIG. 6. Then, the layer 60 of pocket implants in region 16 is annealed. In an exemplary embodiment, a laser spike anneal (LSA) process is performed. For example, the LSA process may heat the layer 60 of pocket implants in region 16 to a temperature of about 1100 to about 1250° C. for a duration of about 0.5 to about 5 milliseconds (ms).

Figure 7:
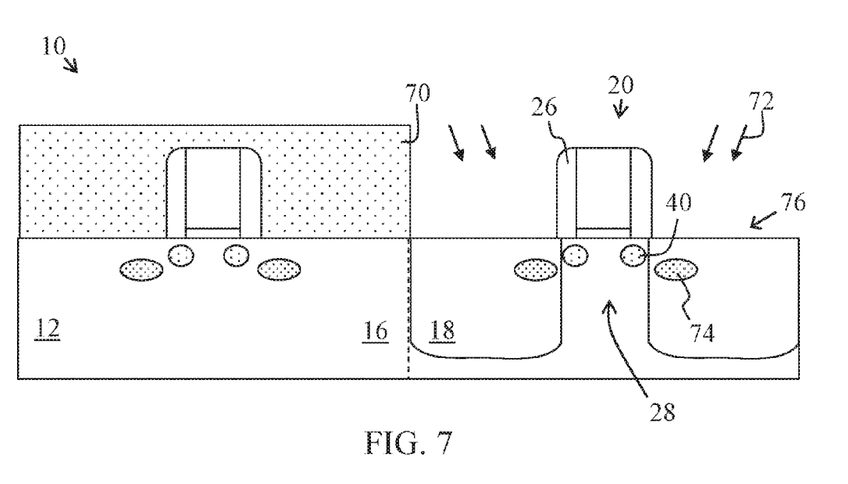

After the layer 60 of pocket implants in region 16 is annealed, a third resist mask 70 is deposited and patterned to cover the first region 16 in FIG. 7. Third resist mask 70 may be formed of the same material and in the same method as resist mask 30 or second resist mask 50, or as one of the other types of masks described above. A fourth pocket implantation for implanting ions, indicated by arrows 72, is performed to form pocket implants 74. In the exemplary embodiment of FIG. 7, the pocket implants 74 are formed as source/drain extension implant regions. Exemplary extension implant regions 74 are formed between the channel region 28 and the anticipated location of the later-formed source/drain regions. The second pocket implantation may be performed using a low energy at a small angle to the surface of the semiconductor substrate 12 so that the extension implant regions extend beneath the spacer 26. The implantation energy is preferably less than the energy used for implanting the later formed source/drain regions. Further, exemplary extension implant regions extend to a depth shallower than the depth of the later-formed source/drain regions.

The first and fourth pocket implantation processes, both performed in the second region 18, may be considered to provide a first portion and a second portion of pocket implants to form a layer 76 of pocket implants in region 18. Specifically, formation of the integrated circuit 10 involves no further pocket ion implantations in region 18. While the exemplary layer 76 of pocket implants includes pocket implant 40 and pocket implant 74, it is envisioned that the layer 76 include as few as one pocket implant or as many as five or more pocket implants as needed in region 18. The layer 76 may include any appropriate number of halo implant regions and extension implant regions.

Figure 8:
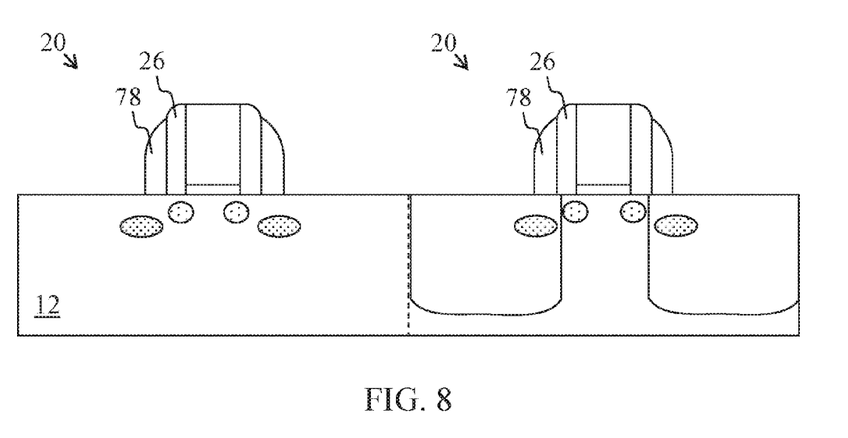

As shown in FIG. 8, third resist mask 70 is removed from the first region 16 and second spacers 78 are formed around the first spacers 26 surrounding each gate structure 20. Specifically, a spacer material, such as silicon oxide, is deposited over the gate structures 20 and semiconductor substrate 12 and is etched to form the second spacers 78 over the semiconductor substrate 12 and around the first spacers 26 surrounding gate structures 20. Alternatively, the first spacers 26 may be removed, and the second spacers 78 may be formed around each gate structure 20.

Figure 9:
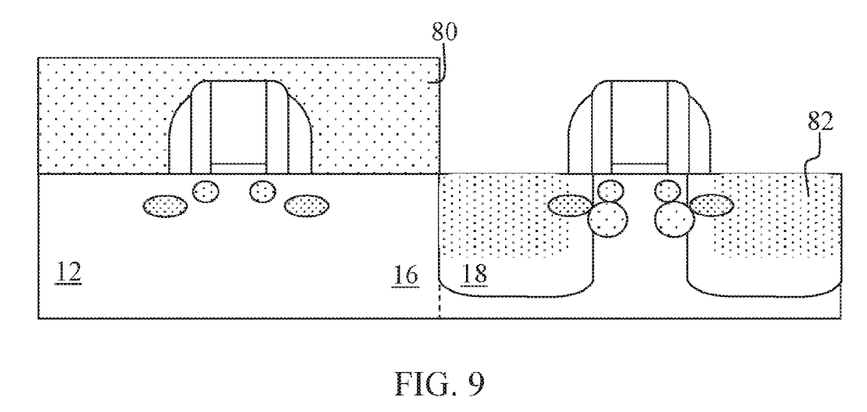
Figure 10:
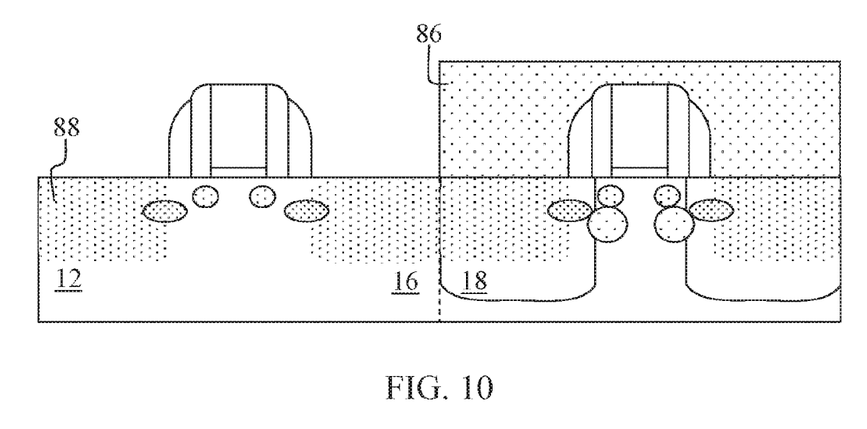

In FIG. 9, another mask 80 is deposited and patterned to cover first region 16. Then, a deep source/drain region implantation process is performed in accordance with conventional processing. As a result, deep source/drain regions 82 are formed in the second region 18. In FIG. 10, the mask 80 is removed from the first region 16 and a mask 86 is deposited and patterned to cover second region 18. Then, a deep source/drain region implantation process is performed in accordance with conventional processing. As a result, deep source/drain regions 88 are formed in the first region 16.

After formation of the deep source/drain regions 82 and 88, annealing steps may be performed to diffuse the implanted regions as desired. In an exemplary embodiment, a laser spike anneal (LSA) process is performed at a temperature of about 1050 to about 1150° C. for a duration of about 0.5 to about 3 ms. This laser anneal process typically involves lower temperatures than the earlier laser anneal, such as about 100 degrees lower, and is typically performed for a shorter duration. Therefore, critical implant regions formed after the earlier laser anneal avoid the higher temperature anneal process and dopant deactivation or damage that may result therefrom. Further, a rapid thermal anneal (RTA) may also be performed at a temperature range of about 1000 to about 1300° C.

Figure 11:
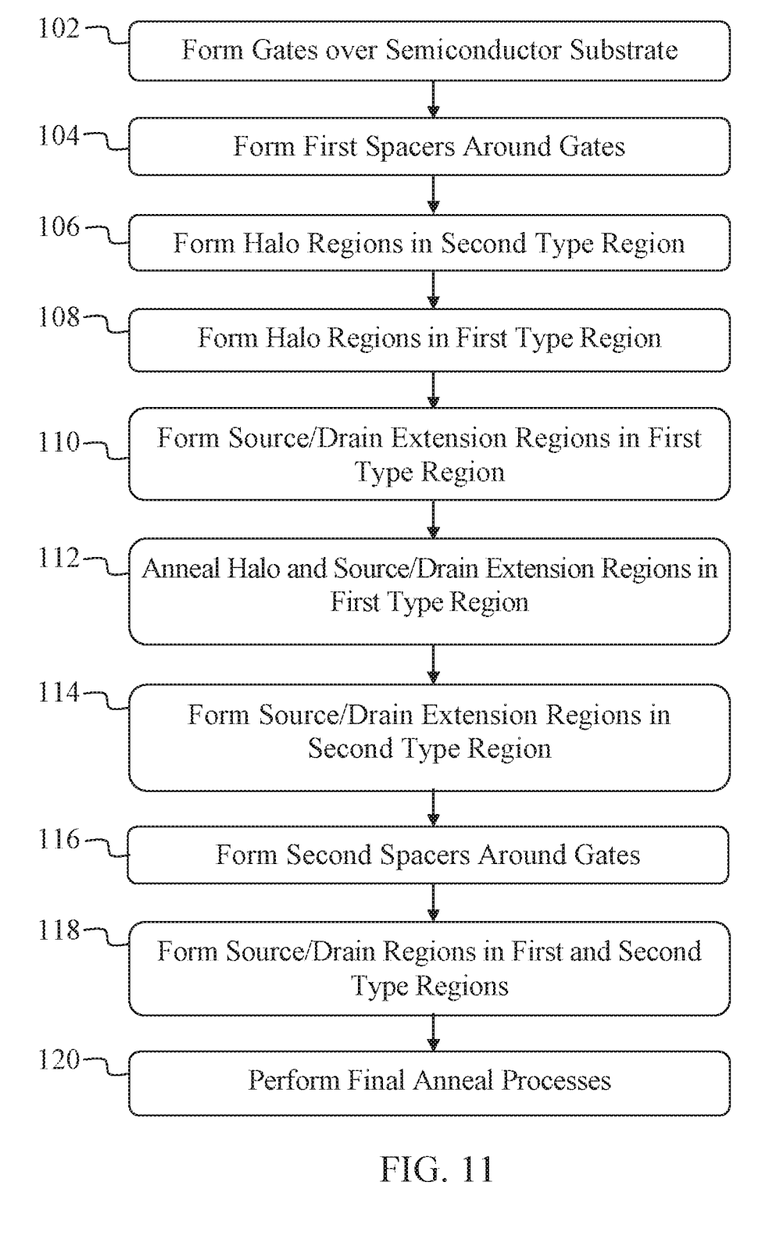
FIG. 11 illustrates, in a flow diagram, method steps for fabricating an integrated circuit in accordance with various embodiments herein.

FIG. 11 illustrates exemplary method steps for fabricating integrated circuits. As shown, the method forms gates over the semiconductor substrate in step 102. First spacers are formed around the gates in step 104. Ion implantations are performed to form halo implant regions in the second type region in step 106.

In step 108, ion implantations are performed to form halo implant regions in the first type region. Further ion implantations are performed to form source/drain extension implant regions in the first type region in step 110. In an exemplary embodiment, no further pocket implants are needed in the first region, i.e., the layer of pocket implants is completed. At step 112, the halo implant regions and source/drain extension implant regions in the first type region are annealed, such as by a laser spike anneal (LSA) process. Then, an ion implantation is performed to form source/drain extension implant regions in the second type region in step 114. The method continues with the formation of deep source/drain regions. Specifically, at step 116, second spacers are formed around the first spacers surrounding the gates. Then, at step 118, an ion implantation is performed to form source/drain regions in the semiconductor substrate adjacent the second spacers, followed by final anneal processes, including another laser spike anneal (LSA) and a rapid thermal anneal (RTA) of the source/drain region at step 120.

In order to improve performance of integrated circuits 10 formed in accordance with the methods herein, it is contemplated that critical pocket implants be formed in the final portion of the ion implantations such that the number of high temperature laser spike anneal (LSA) processes that they undergo are minimized. The criticality of the pocket implants may be determined by the importance of the pocket implant to device performance, the fragility of the pocket implants, or other factors. In an exemplary embodiment, the pocket implant for forming source/drain extension implant regions in an NMOS area is performed after the halo implant regions and source/drain extension implant regions in the PMOS area are formed and annealed by LSA. In addition to the pocket implants, co-implants like fluorine or nitrogen may be added before, after, or in between the pocket implants described above.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
   providing a structure having an n-channel gate stack and a p-channel gate stack formed over a semiconductor substrate;
   forming halo regions in the semiconductor substrate adjacent the n-channel gate stack;
   after forming and before annealing the halo regions in the semiconductor substrate adjacent the n-channel gate stack, forming halo regions in the semiconductor substrate adjacent the p-channel gate stack;
   annealing the halo regions in the semiconductor substrate adjacent the p-channel gate stack;
   forming extension regions in the semiconductor substrate adjacent the n-channel gate stack;
   forming first spacers around the p-channel gate stack and the n-channel gate stack before forming the halo regions in the semiconductor substrate adjacent the n-channel gate stack; and
   forming second spacers around the first spacers around the p-channel gate stack and the n-channel gate stack after forming the extension regions in the semiconductor substrate adjacent the n-channel gate stack.

2. The method of claim 1 further comprising forming extension regions in the semiconductor substrate adjacent the p-channel gate stack, wherein annealing the halo regions in the semiconductor substrate adjacent the p-channel gate stack comprises annealing the halo regions and the extension regions in the semiconductor substrate adjacent the p-channel gate stack.

3. The method of claim 1 wherein forming the extension regions in the semiconductor substrate adjacent the n-channel gate stack comprises:
   forming the extension regions in the semiconductor substrate adjacent the n-channel gate stack after annealing the halo regions in the semiconductor substrate adjacent the p-channel gate stack and before annealing the halo regions in the semiconductor substrate adjacent the n-channel gate stack.

4. A method for fabricating an integrated circuit, the method comprising:
   providing a structure having an n-channel gate stack and a p-channel gate stack formed over a semiconductor substrate;
   forming halo regions in the semiconductor substrate adjacent the n-channel gate stack;
   after forming and before annealing the halo regions in the semiconductor substrate adjacent the n-channel gate stack, forming halo regions in the semiconductor substrate adjacent the p-channel gate stack;
   annealing the halo regions in the semiconductor substrate adjacent the p-channel gate stack; and
   forming extension regions in the semiconductor substrate adjacent the n-channel gate stack, wherein forming the extension regions in the semiconductor substrate adjacent the n-channel gate stack comprises forming the extension regions in the semiconductor substrate adjacent the n-channel gate stack after annealing the halo regions in the semiconductor substrate adjacent the p-channel gate stack.

5. The method of claim 4 further comprising:

forming first spacers around the p-channel gate stack and the n-channel gate stack before forming the halo regions in the semiconductor substrate adjacent the n-channel gate stack; and forming second spacers around the p-channel gate stack and the n-channel gate stack after forming the extension regions in the semiconductor substrate adjacent the n-channel gate stack.

6. The method of claim 5 further comprising forming source/drain regions in the semiconductor substrate adjacent the second spacers.

7. The method of claim 6 further comprising annealing the source/drain regions in the semiconductor substrate by performing a laser anneal process.

8. The method of claim 6 further comprising annealing the source/drain regions in the semiconductor substrate.

9. The method of claim 8 further comprising annealing the structure using a rapid thermal anneal (RTA) process to form an n-type field effect transistor and a p-type field effect transistor over the semiconductor substrate.

10. A method for fabricating an integrated circuit, the method comprising:

providing a semiconductor substrate with first gates overlying second conductive type regions in the semiconductor substrate and second gates overlying first conductive type regions in the semiconductor substrate;

forming halo regions in the semiconductor substrate adjacent selected first gates;

after forming and before annealing the halo regions in the semiconductor substrate adjacent the selected first gates, forming extension regions in the semiconductor substrate adjacent selected second gates; and after forming and before annealing the halo regions in the semiconductor substrate adjacent the selected first gates, annealing the extension regions in the semiconductor substrate adjacent the selected second gates.

11. The method of claim 10 wherein:

forming extension regions in the semiconductor substrate adjacent the selected second gates comprises forming a layer of pocket regions in the semiconductor substrate adjacent the selected second gates;

annealing the extension regions in the semiconductor substrate adjacent the selected second gates comprises annealing the layer of pocket regions in the semiconductor substrate adjacent the selected second gates by performing a laser anneal process; and the method further comprises forming extension regions in the semiconductor substrate adjacent the selected first gates after annealing the extension regions in the semiconductor substrate adjacent the selected second gates.

12. The method of claim 10 wherein annealing the extension regions in the semiconductor substrate adjacent the selected second gates comprises performing a laser anneal process.

13. The method of claim 10 further comprising forming extension implant regions in the semiconductor substrate adjacent selected first gates after annealing the extension regions in the semiconductor substrate adjacent the selected second gates.

14. The method of claim 13 further comprising:

forming first spacers around the selected first gates and the selected second gates before forming the extension regions in the semiconductor substrate adjacent the selected second gates; and forming second spacers around the first spacers around the selected first gates and the selected second gates after forming the extension regions in the semiconductor substrate adjacent the selected second gates.

15. The method of claim 13 further comprising:

forming first spacers around the selected first gates and the selected second gates before forming extension regions in the semiconductor substrate adjacent the selected second gates; and forming second spacers around the selected first gates and the selected second gates after forming extension regions in the semiconductor substrate adjacent the selected second gates.

16. The method of claim 15 further comprising forming source/drain regions in the semiconductor substrate adjacent the second spacers.

17. The method of claim 16 further comprising annealing the source/drain regions in the semiconductor substrate by performing a laser anneal process.

18. The method of claim 16 further comprising annealing the source/drain regions in the semiconductor substrate.

19. The method of claim 18 further comprising annealing the structure using a rapid thermal anneal (RTA) process to form an n-type field effect transistor and a p-type field effect transistor over the semiconductor substrate.

* * * * *